(12) United States Patent
Ruff

(10) Patent No.: US 9,509,304 B2
(45) Date of Patent: Nov. 29, 2016

(54) INDUCTION GENERATOR

(75) Inventor: Eduard Ruff, Auerbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 329 days.

(21) Appl. No.: 14/130,717

(22) PCT Filed: Jun. 18, 2012

(86) PCT No.: PCT/EP2012/061542
§ 371 (c)(1),
(2), (4) Date: Jan. 3, 2014

(87) PCT Pub. No.: WO2013/007474
PCT Pub. Date: Jan. 17, 2013

(65) Prior Publication Data
US 2014/0139048 A1 May 22, 2014

(30) Foreign Application Priority Data
Jul. 11, 2011 (DE) .................. 10 2011 078 932

(51) Int. Cl.
*H02K 41/02* (2006.01)
*H03K 17/97* (2006.01)
(Continued)

(52) U.S. Cl.
CPC ............ *H03K 17/97* (2013.01); *G08C 17/00* (2013.01); *H02K 35/02* (2013.01); *G08C 2201/11* (2013.01); *Y10T 307/977* (2015.04)

(58) Field of Classification Search
CPC ... H02K 35/02; G08C 17/00; G08C 2201/11
USPC .......................................... 310/12.12; 335/80
See application file for complete search history.

(56) References Cited

U.S. PATENT DOCUMENTS 4,471,353 A 9/1984 Cernik
6,538,349 B1 3/2003 Lee et al.
(Continued)

FOREIGN PATENT DOCUMENTS

DE 198 52 470 A1 5/2000
DE 101 25 059 A1 12/2002
(Continued)

OTHER PUBLICATIONS

German Search Report Corresponding to 10 2011 078 932.4 mailed Feb. 8, 2012.
(Continued)

*Primary Examiner* — Hanh Nguyen
(74) *Attorney, Agent, or Firm* — Davis & Bujold, PLLC; Michael J. Bujold

(57) ABSTRACT

An induction generator, for a wireless switch, having a magnetic element with north pole and south pole contact sections, and a coil core having pole contact sections, which can contact with the north pole contact section and the south pole contact section. The magnetic element and the coil core are disposed so as to be movable relative to one another so that a reversal of the magnetic flux direction in the coil core can be generated when switching between first and second idle position, which define a direction of relative movement, in which the north pole and the south pole contact sections each contacts the respective associated pole contact sections. The induction generator has a magnetizable sliding contact section for sliding guidance of the relative movement between the coil core and magnetic element, and this sliding contact section extends parallel to the direction of movement.

16 Claims, 4 Drawing Sheets

(51) Int. Cl.
*G08C 17/00* (2006.01)
*H02K 35/02* (2006.01)

(56) References Cited

U.S. PATENT DOCUMENTS

| | | | |
|---|---|---|---|
| 7,786,887 B2 | 8/2010 | Schmidt | |
| 7,839,242 B1* | 11/2010 | Hopper | H02M 3/34 335/87 |
| 8,228,151 B2 | 7/2012 | Schmidt | |
| 2002/0172060 A1 | 11/2002 | Takeuchi | |
| 2003/0155828 A1 | 8/2003 | Cheung et al. | |
| 2005/0001500 A1 | 1/2005 | Chertok | |
| 2005/0035600 A1 | 2/2005 | Albsmeier et al. | |
| 2011/0133975 A1 | 6/2011 | Cartier Millon et al. | |
| 2013/0069451 A1* | 3/2013 | Ruff | H02K 35/02 310/12.12 |
| 2013/0093540 A1* | 4/2013 | Ruff | E04B 1/21 335/4 |
| 2013/0285480 A1* | 10/2013 | Ruff | H02K 7/1876 310/12.12 |
| 2015/0137626 A1* | 5/2015 | Cheng | H02K 35/02 310/12.26 |

FOREIGN PATENT DOCUMENTS

| | | |
|---|---|---|
| DE | 102 56 156 A1 | 4/2004 |
| DE | 103 15 764 A1 | 10/2004 |
| DE | 103 15 765 A1 | 11/2004 |
| EP | 0 836 166 A1 | 4/1998 |
| EP | 2 119 621 A1 | 11/2009 |
| JP | 2005-151750 A | 6/2005 |
| WO | 2005/031952 A1 | 4/2005 |

OTHER PUBLICATIONS

International Search Report Corresponding to PCT/EP2012/061542 mailed Sep. 13, 2013.
Written Opinion Corresponding to PCT/EP2012/061542 mailed Sep. 13, 2013.

* cited by examiner

INDUCTION GENERATOR

This application is a National Stage completion of PCT/EP2012/061542 filed Jun. 18, 2012, which claims priority from German patent application serial no. 10 2011 078 932.4 filed Jul. 11, 2011.

FIELD OF THE INVENTION

The present invention relates to an induction generator for a wireless switch, in particular for a miniature snap-action switch.

BACKGROUND OF THE INVENTION

Numerous induction generators have been proposed in the prior art that can be used at present in an energy self-sufficient wireless switch.

DE 103 15 765 A1 discloses an electromagnetic energy converter, in which an element enclosed by a coil can be moved relative to a permanent magnet, wherein the magnetic flux is shut off by the movable element in a first and a second rest position. The energy converter is designed in such a way that the magnetic flux in the coil is reversed due to a tilting movement of the movable elements around an axis.

DE 198 52 470 A1 discloses a power generation system, in which permanent magnets, which are disposed on a carrier rail and arranged having alternating polarity, are moved in a oscillating circuit past an induction coil assembly, wherein an air gap is provided between the permanent magnet and the induction coil assembly.

In order to design a wireless switch such that it can be miniaturized at present, a high degree of electrical energy must regularly be generated by the mechanical actuation process of the switch, despite the small design size of the induction system. To this end, as is known, the switching process must occur as quickly as possible (abruptly). Accordingly, the movable element must be accelerated quickly, and decelerated with corresponding force. At the same time, this can lead to a mechanical bounce, which can result in reciprocal induction effects and therefore to a loss of energy, as well as to problems of strength in the wireless switch. In addition, acoustic noise is generated by the switching process, which may be undesirable depending on the application of the wireless switch. Moreover, a correspondingly greater actuation force effort is needed in order to achieve a switching process by means of a separation between the magnetic element and coil core when switching between the idle positions that generate an induced voltage. The known solutions are therefore open to improvement.

SUMMARY OF THE INVENTION

The proposed induction generator counters the problems described above. The induction generator comprises a magnetic element and a coil core. A magnetic element is understood to refer to a component that comprises at least one permanent magnet having sections at the north pole and south pole that can be contacted, wherein these sections can be points, lines or surfaces. These sections will be referred to in the following as the north pole contact section and south pole contact section. A magnetic flux can be generated by means of these sections through magnetic contact with those same sections. To this end, the coil core is provided, which is formed by a magnetizable material such as iron or the like. The coil core comprises at least two pole contact sections, which are disposed such that they can be contacted with the north pole contact section and the south pole contact section. The coil core is preferably formed in a U-shape. Within the meaning of the present invention, a U-shape is understood to be any shape that has at least two pole contact sections pointing in the same direction. Thus a U-shape preferably also includes C-shaped and V-shaped embodiments. The coil core also preferably comprises at least three pole contact sections, which point essentially in the same direction. In this case, the coil core can also preferably be formed in an E-shape or W shape.

A magnetic flux that runs between the north pole and the south pole of the magnetic element is generated over the coil core by means of one pole contact section contacting the north pole contact section, while the other pole contact section simultaneously contacts the south pole contact section. A reversal of the magnetic flux direction is necessary in order to be able to generate an induced voltage. For this reason, the coil core and the magnetic element are disposed such as to be movable relative to one another. In other words, the coil core or the magnetic element can be provided such that they are movable. Alternatively, both the coil core and the magnetic element can be disposed such that they are movable. These are preferably disposed in a fixture, which can be a housing, for example of a wireless switch, for which the induction generator is preferably provided. Accordingly, the coil core and the magnetic element can have mechanisms, which allow interaction with the fixture in such a way that either the coil core or the magnetic element or optionally one of these components or both components can be moved simultaneously, whereby the movement relative to one another can be generated. Specifically, the coil core and the magnetic element are disposed so as to be movable relative to one another, at least between a first idle position and a second idle position. The movement of the coil core and/or of the magnetic element is preferably performed by means of an actuator that can be coupled with the coil core or magnetic element, this actuator being operated such that it can be at least manually or mechanically controlled, and can transfer the actuation force exerted during operation to the coil core or the magnetic elements respectively, in order to compel the relative movement. The abrupt switch from one idle position to the other idle position can preferably occur as a function of the actuation speed. The actuation speed preferably corresponds to the switching speed with which a switch is made from the one idle position to the other idle position. This can be achieved, for example, by means of allowing the coil core or the magnetic element to be directly coupled to the actuator.

In the respective idle position, a magnetic flux is generated between the coil core and magnetic element, wherein the generated magnetic flux runs in a direction that is opposite the direction in which the generated magnetic flux runs in the other idle positions. Through the preferably abruptly generated reversal of the magnetic flux direction, a reversal in the polarity of the coil can be generated in the conventional manner, this reversal of polarity, in cooperation with an induction coil that preferably surrounds the coil core, leading to an induced voltage. More than two idle positions can also be provided. In this case, an arrangement is preferred such that a reversal in the polarity of the coil can be achieved when switching between two adjacent idle positions in order to generate an induced voltage.

The north pole and south pole contact section of the magnetic element is formed accordingly, in order to generate the magnetic flux by means of the coil core. In order to enable switching between at least two idle positions with a reversal of the magnetic flux direction associated therewith in an induction generator having the smallest possible design, the magnetic element, in reference to an exemplary coil core comprises two pole contact sections, preferably has two north pole contact sections, which border a south pole contact section, or two south pole contact sections, which border north pole contact section. The two south pole or north pole contact sections respectively can preferably be realized by means of a U-shaped pole shoe, disposed such that it rests against the corresponding pole of the permanent magnet. The respective arms of the pole shoe enclose the permanent magnet, wherein the free pole of the permanent magnet preferably rests against an additional pole shoe, which forms the other of the two south pole or north pole contact section of the magnetic element. The pole contact sections of the coil core and the magnetic element are preferably each disposed so that they are parallel to the direction of the relative movement. The contact surfaces formed by the respective pole section and south pole section, or north pole contact sections are also preferably disposed in a common plane.

In an alternative preferred embodiment in reference to an E- or W-shaped coil core, the magnetic element preferably has a north pole contact section and a south pole contact section, which are disposed in such a way that these can be brought into contact with at least three pole contact sections of the coil core in at least two idle positions in order to reverse the magnetic flux direction. For example, to this end, the magnetic element can have a U-shape, wherein the respective free ends of the arms of the U-shape preferably form the north pole contact section and the south pole contact section. In addition, the bottom of the U-shape can preferably be formed by the permanent magnet.

The induction generator also has a sliding contact section, which extends parallel to a direction of movement of the coil core and/or of the magnetic element, referred to as the movable component in the following. The direction of movement, or the direction of the relative movement, respectively, is determined by the arrangement of the idle positions. Accordingly, the direction of movement of the movable component runs parallel to a line of movement between the idle positions, along which line of movement the movable component can be moved.

The sliding contact section is formed from a magnetizable material. The sliding contact section can preferably be formed by a plurality of dot-like, one or a plurality of line-like and/or surface-like sliding contact surfaces. The sliding contact surface preferably covers at least 100% of at least one contact surface formed by the pole contact section or the associated north pole or south pole contact section respectively, which contact surface is provided as the passage surface for the magnetic flux associated to the respective contact section in the respective idle position. The sliding contact surface preferably covers more than 100% of the passage surface. In other words, the sliding contact surface extends beyond the passage surface on at least one side thereof in the direction of the relative movement and/or transversely thereto. In this way, the magnetic flux or the flux density between the coil core and magnetic element can be further improved in the respective idle position.

In the case of sliding contact section, the relative movement between the coil core and the magnetic element can be slidably guided. Guidance within the meaning of the present invention exists when the movable component can be moved in the direction of movement along the sliding contact section, or the sliding contact surface, respectively.

Sliding guidance is understood to mean a movement of the movable component along the relative movement or in the direction of movement of the movable component in contact with the sliding contact section. In other words, the coil core and/or the magnetic element can be slidably guided during a relative movement along the sliding contact section, in particular along the sliding contact surface. The sliding contact section is preferably such that, during the relative movement, the movable component rests on the sliding contact surface of the sliding contact section or is connected magnetically to the sliding contact section, preferably directly, i.e. without an intermediate air gap with the exception of a production or tolerance-related air gap. Such production or tolerance-related air gaps between the contacting contact surfaces cannot be avoided entirely and preferably must be understood as inherent in a sliding guidance. The sliding guidance ensures that the magnetic element remains in magnetic contact with the coil core during the switching between the idle positions. Thus the actuation force for carrying out that switch can be reduced, since a complete separation of the magnetic element from the coil core can be prevented. Specifically, an actuation force that is at least equal to or greater than the magnetic pull is needed for a separation against the direction of the magnetic pull. As a result of the sliding guidance, thus the contact between the magnetic element and coil core that is created by means of the sliding contact section during the relative movement, the actuation force needed for switching between the idle positions is substantially reduced. The sliding contact section, in particular the sliding contact surface, preferably extends perpendicular to the magnetic pull exerted between the magnetic element and the coil core. In other words, the sliding contact section preferably extends perpendicular to the contact surface formed between the pole contact section and the associated north pole or south pole contact section. The actuation force needed to switch between the idle positions can thereby be reduced to an amount of at most 30%, preferably to an amount that falls in the range of 20% to 30% of the magnetic pull. Thus when switching between the idle positions, the usual mechanical bouncing, in which the magnetic element and the coil core are briefly magnetically separated from one another, no longer occurs, and shortly thereafter, they come into contact with one another again, whereby a magnetic contact is once again established. This makes it possible to counteract stability problems and energy yield losses. In addition, the degree of actuation freedom can be increased with the above-described induction generator, since an energy output that can be generated by the induction generator can be achieved either dependent on, or independent of, the actuation speed of the actuator that can be coupled with the movable component, and thus can be predetermined by a predefined actuation speed. In addition, the above-described induction generator makes adjustment possible through the selective, predetermined enhancement or suppression of haptics concerning the perception of the switching process and the acoustic noise that is usually generated. Furthermore, due to the modular design of the induction generator, individual components such as the coil core, the magnetic element or a component having the sliding contact section can be easily replaced if needed. Moreover, a tolerance chain caused by the arrangement of the components of the induction generator can be reduced.

The aforementioned effects and additional effects are explained in conjunction with the preferred embodiments presented below.

According to a preferred embodiment, the sliding contact section simultaneously contacts the north pole contact section and the south pole contact section, at least between the intermediate position. In other words, the sliding contact section has an extension that corresponds to the distance between the north pole contact section and the south pole contact section. Thus the sliding guidance of the relative movement when switching between the idle positions can thereby be improved, since a gap formed between the north pole contact section and the south pole contact section can be slidably overcome while simultaneously maintaining the magnetic contact.

According to an additional preferred embodiment, the sliding contact section is formed at least by the pole contact section of the coil core. Thus no additional component, with the exception of the coil core and the magnetic element, needs to be provided in order to achieve the sliding guidance of the relative movement. The design of the induction generator can thereby be kept simple. This embodiment requires, however, that all components of the coil core and of the magnetic element be positioned very precisely, relative to one another.

According to a preferred embodiment, the sliding contact section forms a sliding guidance for the magnetic element, since the sliding contact section extends at least partially across a gap formed between adjacent pole contact sections of the coil core. The sliding contact element sector also preferably has an extension in the direction of the relative movement, starting at the pole contact section that corresponds to the distance between the north pole contact section and the south pole contact section. In this way, the gap formed between the north pole contact section and the south pole contact section can likewise be overcome in a slidably guided manner, while maintaining the magnetic contact, whereby the sliding guidance of the relative movement can be further improved as described above.

In the case of an additional preferred embodiment, the sliding contact element can be attached to the pole contact section in a simple manner. The sliding contact element can enclose the pole contact section on opposing sides, or more preferably, completely enclose that pole contact section. At the same time, the sliding contact element can preferably overhand on the side of the pole contact section facing away from the gap formed between two adjacent pole contact sections, at least by an amount that corresponds to the dimensions of the north pole contact section or the south pole contact section in the direction of movement. In this way, the magnetic element can be reliably slidably guided when switching between the idle positions while maintaining the magnetic contact between the coil core and the magnetic element.

According to a preferred alternative embodiment the sliding contact element forms a sliding guidance for the coil core, wherein the sliding guidance of the coil core can be improved since the gap between the north pole contact section and the south pole contact section can be overcome by the coil core in a slidably guided manner while maintaining the magnetic contact. The sliding contact element also preferably comprises a cutout for enclosing the north pole and/or south pole contact section. The enclosure can preferably be on opposing sides of the north pole or south pole contact section respectively, or more preferably, the enclosure may be completely encompassing. The sliding contact element can thereby be disposed on the magnetic element in a simple manner.

According to another preferred embodiment the sliding contact element is preferably disposed between the coil core and the magnetic element in such a way that the coil core, at least with the pole contact sections thereof, and the magnetic element, at least with the north pole contact section and the south pole contact section thereof, are able to contact the sliding contact element at the associated surface side of the sliding contact element. The surface sides thereby form a bearing surface for the stationary component and a sliding contact surface for the movable component. In other words, the surface side forms a bearing surface, when the coil core or the magnetic element, in abutting this surface side, forms the immovable, thus stationary, component during the relative movement. By contrast, the surface side forms the sliding contact surface for the component that is moved during the relative movement. A sliding guidance of the movable component can be achieved with a sliding contact element formed in this manner, preferably along the entire movement path of the relative movement, while maintaining the magnetic contact. The sliding guidance is thereby further improved. The sliding guidance generally determines the frictional forces, which must be overcome by a correspondingly increased actuation force during the relative movement. Nevertheless, the frictional forces result in lower energy yield losses than are caused by bouncing. Despite the frictional forces, the actuation force can be reduced to the preferred amount described above. In order to compensate for or reduce the frictional forces, the sliding contact surface can preferably be surface-treated. Various lubricant modifiers such as grease, oil, coatings or the like are preferably used, in order to provide an improved sliding contact surface with an eye towards friction losses. Alternatively or in addition, it is preferable that the sliding contact surface be polished.

The sliding contact element is also preferably disposed on the magnetic element, which also preferably forms the movable component. A constant auxiliary magnetic flux will be generated between the north pole contact section and the south pole contact section by means of the sliding contact element. Nevertheless, the amount of auxiliary magnetic flux is relatively small and has very little impact on the primary magnetic flux generated between the coil core and the magnetic element in the idle position. The marginal influence can preferably be further reduced by the fact that the sliding contact element is formed by a thin sheet or a foil. The sliding contact element formed by a thin sheet preferably has a maximum thickness of less that 3 mm, since the thickness, and therefore the cross section, of the sliding contact element exerts a substantial influence on the auxiliary magnetic flux. A magnetizable foil having a thickness of 0.05 mm to 0.1 mm is also preferably used. Depending on the use and size of the induction generator, thicker foils or thin sheets can be used as a sliding contact element, taking into consideration the influence of the cross section. As a result of the small cross section of the sliding contact element associated with the preferred low thickness, the amount of auxiliary magnetic flux can be lowered to an optimal level, or regulated to a predetermined level, respectively. In principle, the amount of auxiliary magnetic flux can be reduced or minimized as the cross section of the sliding contact element decreases. On the basis of the small cross section, the sliding contact element is already so saturated when there is a weak auxiliary magnetic flux, that once saturation is reached, the sliding contact element allows the magnetic flux to pass freely into the primary direction of flow. The saturation value can preferably be additionally or alternatively optimized by a suitable choice of material for the sliding contact element. In this context, the sliding contact element is further preferably formed from a material that fulfills the features described.

According to a further preferred embodiment, the cross section of the sliding contact element can be further reduced. At least one cutout is preferably disposed in a region of the sliding contact section formed between the north pole contact section and the south pole contact section, whereby the amount of ancillary magnetic flux can be further optimized. The cutout further preferably has an extension parallel to the direction of the relative movement, which extension is smaller than an extension of the gap formed between the north pole contact section and south pole contact section, which is oriented in the same direction. Thus the maximum possible magnetic flux (primary magnetic flux) can be ensured between the coil core and magnetic element on the passage surface or on the contact surface thereof.

The effect of the ancillary magnetic flux can also preferably be compensated for by a stronger permanent magnet, which is preferably up to 5% stronger than a permanent magnet, which is not subject to any interference effect as a result of an ancillary magnetic flux.

According to an additional preferred embodiment, an induction generator can be provided to carry out the relative movement, this induction generator having a predetermined definable energy output and/or haptics for switching between the idle positions, independent of the actuation force and actuation speed. According to this embodiment, an abruptly accelerated movement of the movable component in the direction of the relative movement is made possible starting at a position, in particular at a position corresponding to the intermediate position, at which the effect of the spring device becomes effective.

An induction generator defined as a first alternative embodiment can be realized, for example, by beveling the end of a pole contact section, wherein the end has equal or preferably, a reduced thickness extending parallel to the direction of the relative movement than a gap formed between the north pole contact section and the south pole contact section. Alternatively, the magnetic element can preferably also be such that the distance between the north pole and south pole contact section can be selected such that it is equal to or preferably greater than the thickness of the free end of the pole contact section. Thus it is possible to abruptly switch into the other idle position, preferably from the intermediate position, at the predetermined definable switching speed, which leads to a predefined energy output by the induction coil depending on the switching speed. The switching speed can preferably be predefined by means of an auxiliary actuator, wherein the auxiliary actuator can be disposed between the actuator and the movable component and can be coupled with these in such a way that the actuation force that can be exerted on the actuator can be transferred to the movable component. The auxiliary actuator is designed in such a way that the movable component can be moved at a predefined switching speed in order to compel relative movement after activating the actuator, independent of the actuation speed exerted on the actuator. The auxiliary actuator comprises an energy store for receiving and storing actuation energy transmitted from the actuator to the auxiliary actuator, and a mechanism for discharging the potential energy as kinetic energy to the movable component, leaving the position at which the spring device becomes effective. The auxiliary actuator is preferably a spring element, more preferably a leaf spring or a coil spring. According to this preferred exemplary embodiment, the actuation speed, with which the actuator is operated, has no influence on the possible energy output of the induction coil surrounding the coil core, since the switching process or the switching speed of the movable component from one into the other idle position primarily depends on the magnetic strength of the permanent magnet and the spring constant of the spring element. Thus an induction generator having a consistently achievable defined energy output can be provided. In addition, haptics that indicate that the switch has occurred can be additionally or alternatively provided. This is because, in the position in which the spring device becomes effective, the switch by means of the abruptly accelerated movement of the movable component is at least clearly noticeable. Depending on the defined relationship, in conjunction with the spring constant, the haptic effect can be predefined and regulated.

The same effects can be achieved with the additional preferred alternative embodiment in which the projection can preferably be formed by deforming the sliding contact element, with a bonded application or positive locking of a projection element having a predetermined shape with the sliding contact element at a desired position of the induction generator, preferably in a position that corresponds to the intermediate position. The cross section of the projection may vary and may be formed to correspond to the predetermined energy output that must be achieved. The projection can preferably comprise a slope for guiding the movable component in the direction of movement, in order to facilitate the abrupt change-over or switch between the idle positions, preferably from the intermediate position to the idle position disposed in the direction of the relative movement. At the same time, the coil core remains in magnetic contact with the magnetic element along the entire extension of the projection, since the coil core can be slidably guided along the projection and remains in contact with the projection by means of the magnetic pull generated by the permanent magnet. The form of the projection can preferably be adapted accordingly in order to appropriately facilitate the sliding guidance. To this end, the projection can preferably have an obtuse angle. For example, the obtuse angle can be provided at a transition between a sliding contact section that extends in the direction of the relative movement and a sliding contact section that runs transversely thereto, leading towards an apex of the projection, and/or at a transition between a sliding contact section that leads away from the apex of the projection and a sliding contact section extending in the direction of the relative movement. Alternatively, or in addition, the apex of the projection can preferably be formed having an obtuse angle on the side opposite the sliding contact surface.

As was described in conjunction with the first alternative, the constant energy output for the second alternative can likewise be consistently achieved by using an auxiliary actuator as described above in conjunction with the movable component. The haptics can also be regulated by means of the projection. At the same time, in this exemplary embodiment, it is possible to provide an induction generator having adaptable haptics or predefinable energy output in a simple manner, as a result of the ability to replace the sliding contact element with another sliding contact element having a differently formed projection.

According to a further aspect of the present invention, a wireless switch having a transmitter assembly and an antenna is proposed. The wireless switch is capable of utilizing the induced voltage generated by means of the induction generator to transmit a radio signal by means of the transmitter assembly and the antenna. The wireless switch also preferably has an auxiliary actuator that is coupled with the movable component in order to compel the relative movement, as described above. The auxiliary actuator can preferably be a bistable or a monostable spring element. A bistable spring element is understood to be a spring element, by means of which the movable component can be moved repeatedly into one idle position by means of actuation, and into the other idle positions by means of further actuation. A monostable spring element, by contrast, is a spring element, by means of which the movable component can be moved into an idle position by means of actuation and subsequently automatically returned to the other idle position. The monostable spring element can preferably be a single spring element, which integrally forms a spring element that exerts a return force oriented contrary to the actuation force, or may comprise at least spring elements, which act resiliently each in the direction of an idle position and in opposition to one another.

BRIEF DESCRIPTION OF THE DRAWINGS

Additional features and advantages of the invention can be derived from the following description of the embodiments of the invention, based on the drawings in the figures, which show details that are essential to the invention. The individual features can each be realized individually or collectively in any combination in a variant of the invention. Preferred embodiments of the invention will be described below in greater detail based on the drawings. Shown are.

DETAILED DESCRIPTION OF THE PREFERRED EMBODIMENTS

In the following description and drawings, identical reference numbers refer to the same elements or comparable functions.

Figure 1A:
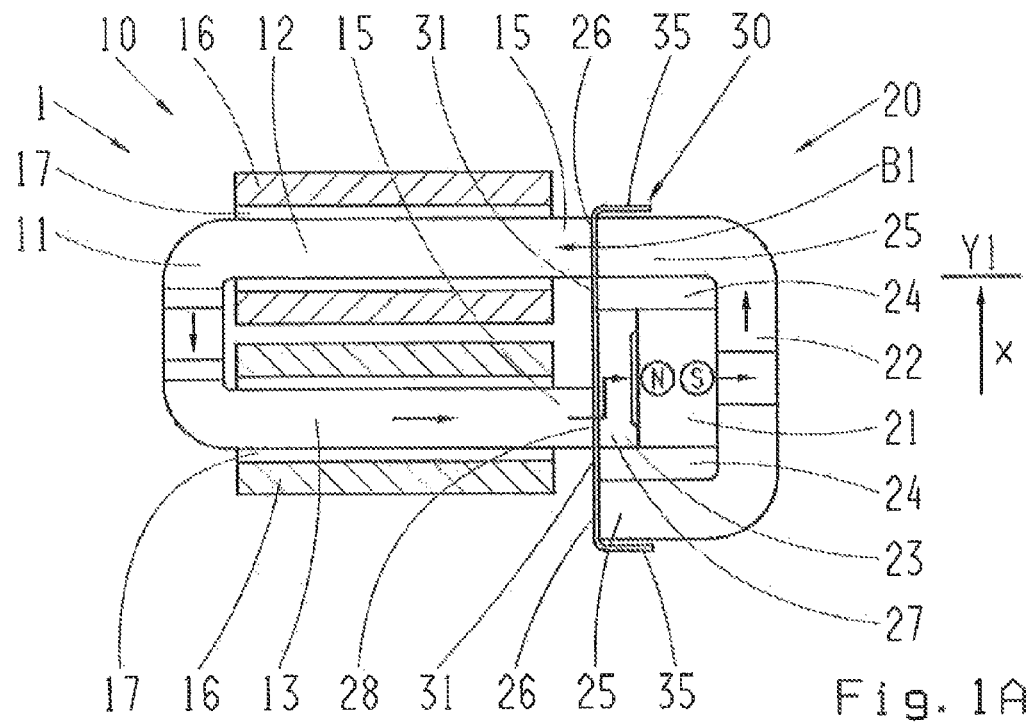
FIG. 1A a schematic side view of an induction generator pursuant to a preferred embodiment in a position that corresponds to a first idle position.
Figure 1B:
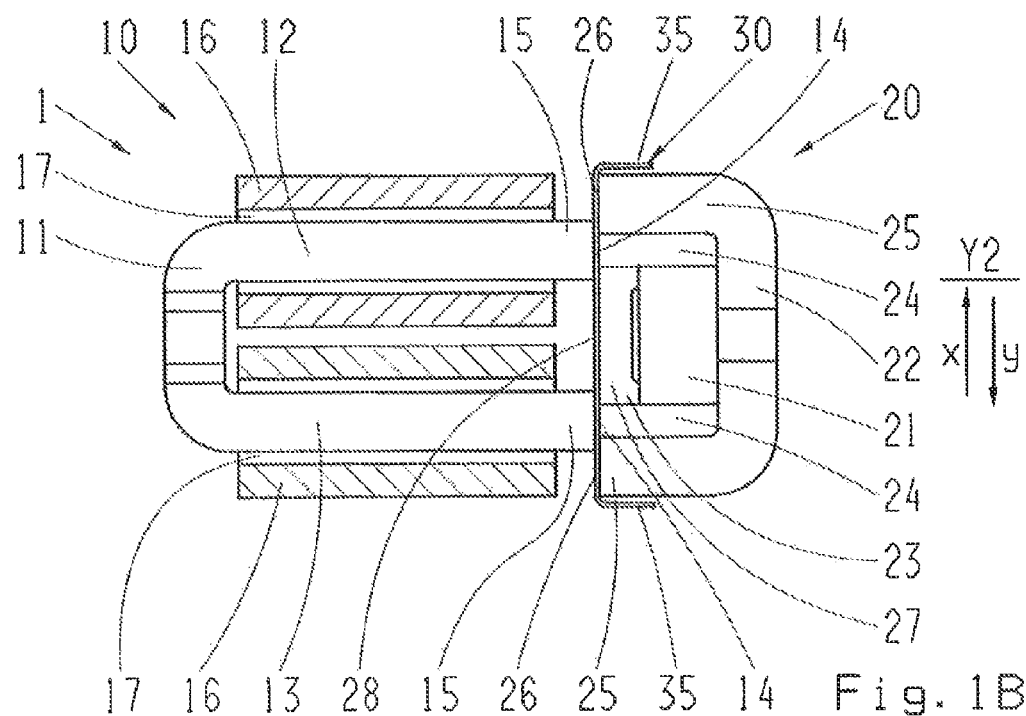
FIG. 1B a schematic side view of the induction generator shown in FIG. 1A in a position that corresponds to an intermediate position.
Figure 1C:
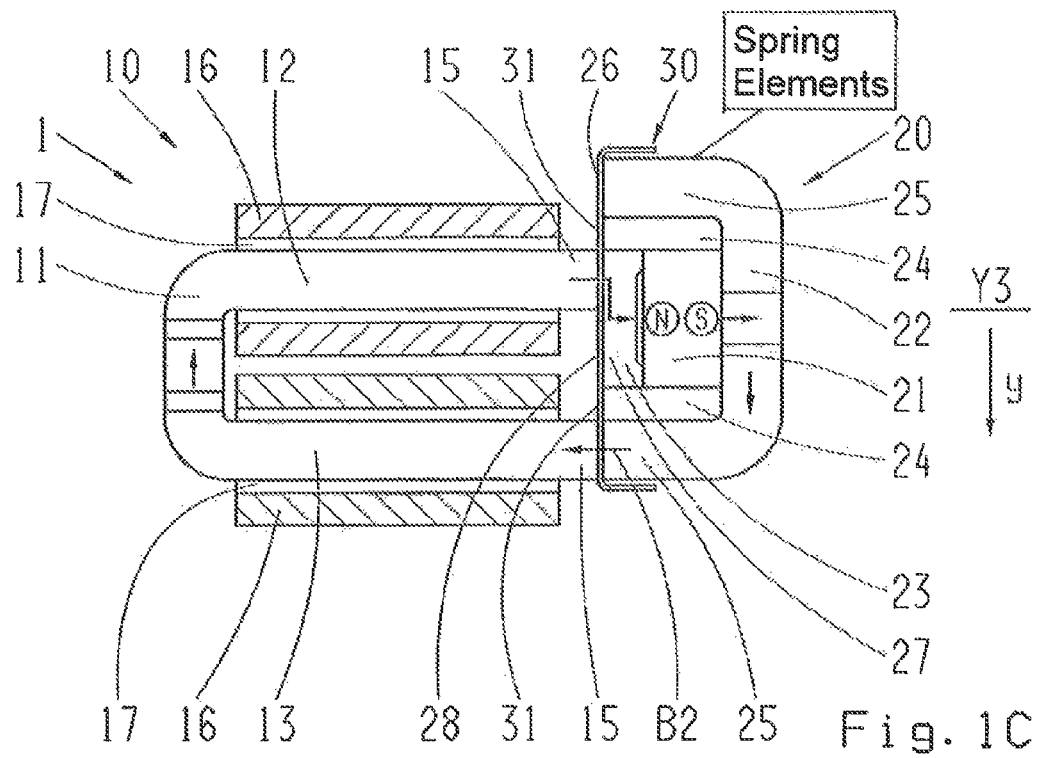
FIG. 1C a schematic side view of the induction generator shown in FIGS. 1A and 1B in a position that corresponds to a second idle position.

FIGS. 1A to 1C show a side view of induction generator 1 pursuant to a preferred embodiment of the present invention, wherein FIG. 1A shows the induction generator 1 in a position that corresponds to a first idle position Y1, FIG. 1B shows the induction generator 1 in a position that defines the intermediate position Y2, and FIG. 1C shows the induction generator 1 in a position that corresponds to the second idle position Y3. The induction generator 1 in this embodiment essentially comprises three components, namely a first component 10, which generates an induced voltage, a second component 20, which generates a magnetic flux, wherein the first 10 and the second component 20 are disposed such that they are movable relative to one another between the first idle position Y1 and the second idle position Y3, and a third component 30, which slidably guides the relative movement between the first 10 and second component 20. The relative movement from the first idle position Y1, through the intermediate position Y2, to the second idle position Y3 is represented as Y in FIGS. 1B and 1C, and the return relative movement from the second idle position Y3, through the intermediate position Y2 to the first idle position Y1 is represented as X in FIGS. 1A and 1B.

The first component 10 of the induction generator 1 comprises two induction coils 16, each of which has a channel 17, wherein the channels 17, or the induction coils 16, respectively, are disposed parallel to one another. Thus two similarly designed induction coils can be used for the induction generator 1, which allows for production costs to be further reduced. The first component 10 additionally has a U-shaped coil core 11 formed from a magnetizable material. The arms 12, 13 of the U-shaped coil core 11 each extend through a channel 17 in such a way that the face 14 of the free ends of the arms 15 that form a pole contact surface extend past the corresponding induction coil 16, each arm forming a pole contact section, wherein the pole contact surface 14 points in a direction away from the U-shape. The arms 12, 13 are preferably fed through the respective channel 17 such that they are centered, in order to be able to generate a consistent induced voltage in each induction coil 16 when there is a reversal in the polarity of the coil.

Figure 4:
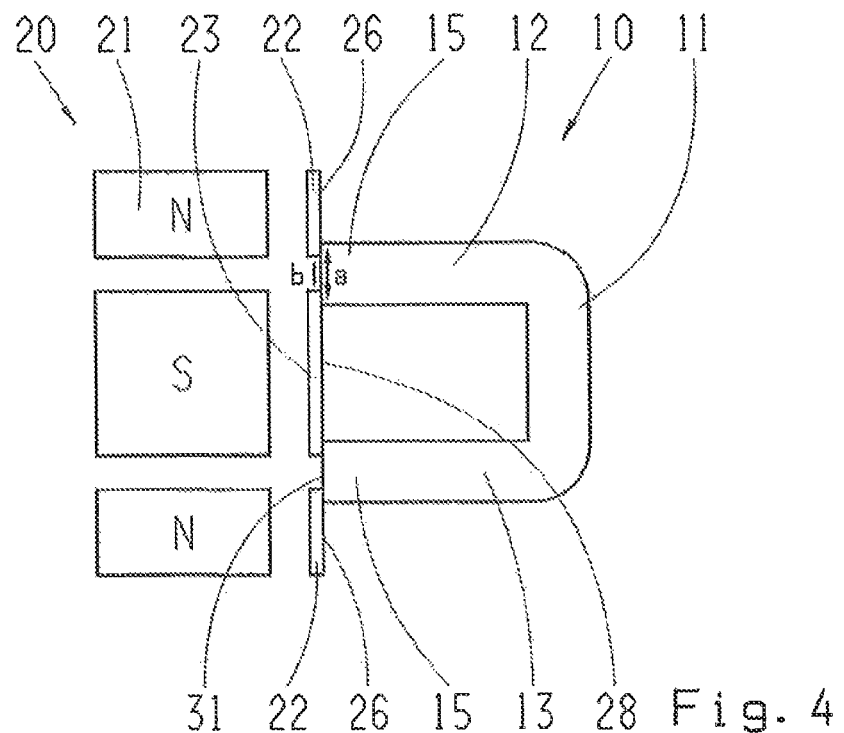
FIG. 4 a schematic side view of an induction generator pursuant to a preferred embodiment in a position that corresponds to an intermediate position.

The second component 20 is disposed opposite the first component 10. The second component 20 is formed by a magnetic element 20, which is disposed opposite the coil core 11 and the induction coils 16. The magnetic element 20 comprises a permanent magnet 21, which is enclosed by two pole shoes 22, 23. The first pole shoe 22 is formed in a U-shape and abuts the south pole S of the permanent magnet 21 in such a way that the respective free arm end 25 of the pole shoe 22, which points toward a first pole shoe surface 26, this pole shoe surface defining a south pole contact surface, extends beyond the surface of the north pole N of the permanent magnet 21 that faces the coil core 11, wherein the respective south pole contact surfaces 26 of the first pole shoe 22 are facing the coil core 11. A second pole shoe 23 corresponding to the dimensions of the north pole surface of the permanent magnet 20 facing the coil core 11 is disposed on the north pole side N of the permanent magnet 21. The second pole shoe 23 is of such a thickness, extending in the direction of the coil core 11, that a second pole shoe surface 28 of the second pole shoe 23, which faces the coil core 11, and which defines the north pole contact surface, is located in a common plane with the south pole contact surfaces 26. The first 22 and second pole shoe 23 comprise a magnetizable material. The first 22 and second pole shoe 23 can be manufactured from the same material as the coil core 11. Alternatively, moreover, the first pole shoe 22 can abut the north pole N of the permanent magnet 20 and the second pole shoe 23 can abut the south pole S (FIG. 2B and FIG. 4). What is essential for this embodiment is that the first pole shoe surfaces 26 and the second pole shoe surface 28 face the pole contact surfaces 14 of the coil core 11 and are disposed in a direction connecting the arms 12, 13 such that they alternate, wherein the first pole shoe surfaces 26 in this direction enclose the second pole shoe surface 28. In this arrangement, the first pole shoe surfaces 26 form outer pole shoe surfaces, while the second pole shoe surface 28 forms a central pole shoe surface.

The south pole contact surfaces 26 and the north pole contact surface 28 are spaced apart from one another in such a way that one of the south pole contact surfaces 26 faces one of the pole contact surfaces 14 such that it is directly opposite in the first idle position Y1, and the north pole contact surface 28 faces another of the pole contact surfaces 14 such that it is opposite in the first idle position Y1, as FIG. 1A in particular shows. Here the upper south pole contact surface 26 shown in FIG. 1A is located directly opposite the pole contact surface 14 of the pole contact section 15 of the upper arm 12, and the north pole contact surface 28 is located directly opposite the pole contact surface 14 of the pole contact section 15 of the lower arm 13. In this embodiment, at least the directly facing surfaces 14, 26 of the pole contact sections 15 of the coil core 11 and the south pole contact sections 25 of the first pole shoe 22 have the same dimensions. In addition, the distance between the respective first 22 and second pole shoe 23 is chosen in such a way that in the second idle position Y3, the other south pole contact surface 26 faces the other of the pole contact surfaces 14 such that it is directly opposite thereto, and the north pole contact surface 28 faces one of the pole contact surfaces 14 such that it is directly opposite thereto, as shown in FIG. 1C. Here, the north pole contact surface 28 of the pole contact surface 14 of the pole contact section 15 of the upper arm 12 and the lower south pole contact surface 26 of the pole contact surface 14 of the pole contact section 15 of the lower arm 13 are located directly opposite one another.

The third component 30 is formed by a sliding contact element 30 that is manufactured from a magnetizable material, which sliding contact element is disposed between the pole contact surfaces 14 and the pole shoe surfaces 26, 28. The thickness of the sliding contact element 30 falls in a preferred range of 0.05 mm to 0.1 mm. The sliding contact element 30 extends in the arrangement direction of the pole shoe surfaces 26, 28 across the entire extent of the second component 20. The sliding contact element 30 covers at least 100% of the respective pole contact surface 14 as well as the respective pole shoe surfaces 26, 28 in a direction that is transverse with respect to this arrangement direction and that defines the width of the induction generator 1.

As FIGS. 1A to 1C further show, the sliding contact element 30 has a U-shaped cross section and is disposed on the magnetic element 20 in such a way that the arms 35 of the sliding contact element 30 abut the magnetic element 20. The arms 35 are preferably pretensioned at the magnetic element 20, preferably in order to not only hold the sliding contact element 30 in a direction facing away from the pole shoe surfaces 26, 28 by means of the magnetic force that exists between the sliding contact element 30 and the magnetic element 20, but to also hold this sliding contact element 30 oriented on the magnetic element 20 in a direction that extends parallel to the relative movement by means of the pretension exerted by the arms 35 on the magnetic element 20. In addition, in a preferred embodiment not shown here, the sliding contact element 30 can have additional fixing elements, which come to rest on the opposite side of at least one of the pole shoes 22, 23 in order to additionally hold the sliding contact element 30 on the magnetic element 20 in the width orientation of the induction generator 1. The length of the arm 35 and preferably of the additional fixing elements can be chosen in such a way that a holding force and pretensioning force can be generated that is sufficient to retain the sliding contact element 30 on the magnetic element 20. As a result of the fact that the sliding contact element 30 is produced from a sheet metal strip or foil, the pretensioning force can easily be achieved by appropriately bending the arm 35 or the fixing elements.

The sliding contact element 30 forms bearing surfaces or sliding contact surfaces 32 for the coil core 11 or the magnetic element 20 respectively on the surface sides of this sliding contact element that face the coil core 11 and the magnetic element 20. The bearing surface, or sliding contact surface 32, respectively, is formed such that it is flat and is in planar contact with the pole contact surfaces 14 of the coil core 11 as well as the pole shoe surfaces 26, 28 of the pole shoes 22, 23. Since the sliding contact element 30 in this embodiment is disposed in a stationary manner on the magnetic element 20, the surface side facing the magnetic element 20 forms a bearing surface for the magnetic element 20, while the surface side of the sliding contact element 30 facing the coil core 11 forms the sliding contact surface 32 for the coil core 11. Embodiments are also conceivable, however, in which the sliding contact element 30 provides two sliding contact surfaces 32; one for the magnetic element 20 and one for the coil core 11, wherein the sliding contact element 30 can be held in a housing that receives the induction generator 1.

As shown in FIGS. 1A to 1C, when switching between the first Y1 and second idle position Y3, the first component 10 is slidably guided along the sliding contact surface 32. In this way, the magnetic element 20 and the coil core 11 are separated from one another in a transverse direction relative to the magnetic pull exerted between these components 10, 20. The actuation force for forcing the relative movement can thus be reduced to a substantial degree. An actuation force that is needed for the sliding relative movement is preferably only, at most, 30% of the magnetic pull between the magnetic element 20 and the coil core 11, and more preferably, that falls in a range of 20% to 30% thereof.

In addition, the sliding contact surface 32 can be treated in order to reduce dynamic frictional forces. Thus the sliding contact surface 32 can be polished, for example, and/or can be treated with lubricant modifiers such as grease, oil, coatings or the like. The actuation force needed to carry out the relative movement, thus after the start of the relative movement, the continuation of the relative movement between the first 10 and second component 20 can thereby be reduced, whereby, on the whole, the relative movement is easier to carry out. It is not necessary that the entire surface of the sliding contact element 30 be treated in order to reduce the frictional forces, but rather, only a sliding contact section 31 corresponding to the movement path of the coil core 11, which comprises the sliding contact surface 32 over which the coil core 11 is slidably guided.

The interaction of the first 10, second 20 and third component 30 is explained in detail below.

As shown in FIGS. 1A to 1C, the sliding contact element 30 connects the south pole contact surfaces 26 with the north pole contact surface 28, whereby this leads to constant ancillary magnetic flux between these surfaces 26, 28. In the respective idle position Y1 and Y3, the ancillary magnetic flux impacts the primary magnetic flux B1, B2 that can be generated between the magnetic element 20 and the coil core 11. The strength of the ancillary magnetic flux is dependent on the cross section of the sliding contact element 30, however, and can be influenced by varying the cross section. In principle, the smaller the cross section of the sliding contact element 30, the lower the impact that the ancillary magnetic flux will have on the primary magnetic flux B1, B2. This is because a smaller cross section results in the magnetization of the sliding contact element 30 becoming saturated more quickly, such that the primary magnetic flux B1, B2 that can be generated between the coil core 11 and magnetic element 20 is no longer impacted once saturation magnetization by the ancillary magnetic flux is reached. In other words, the amount of the primary magnetic flux B1, B2 is reduced by the amount of ancillary magnetic fluxes needed to reach saturation magnetization. The saturation magnetization corresponds to a magnetization in which the sliding contact element 30 does not experience any further magnetization by the permanent magnet, despite the increase in magnetic field strength acting on the sliding contact element 30. A stronger permanent magnet can preferably be used to compensate for the amount of magnetization that is necessarily diverted by means of the ancillary magnetic flux. In the case of the sliding contact element 30 used in this preferred embodiment, which sliding contact element has a thickness of 0.05 mm to 0.1 mm, a permanent magnet that is up to 5% stronger is sufficient.

Figure 5:
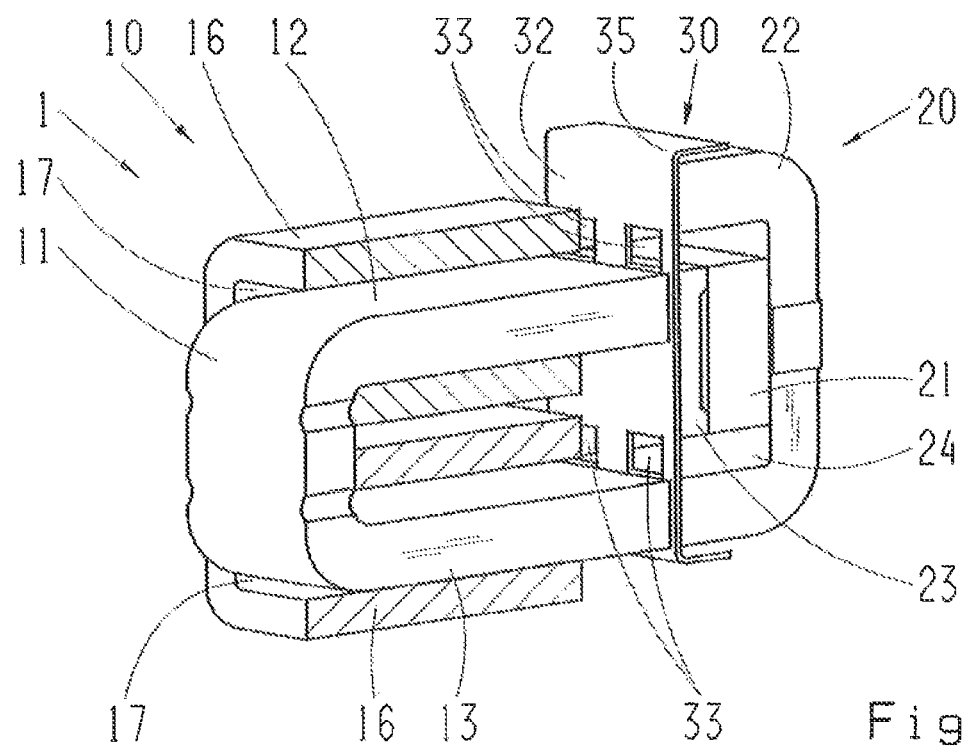
FIG. 5 a perspective side view of an induction generator pursuant to a preferred embodiment in a position that corresponds to a second idle position.

The sliding contact element 30 is also preferably formed from a material that has a greater magnetic conductivity than the material in the pole shoes 22, 23 and of the coil core 11. Moreover, the cross section of sliding contact element 30 can be further reduced by means of cutouts 33 formed in the sliding contact element 30 (FIG. 5). As shown in FIG. 5, the cutouts 33 are disposed in a region that is located opposite a gap 24 formed between the pole shoes 22, 23. The cutouts 33 along the movement path defined by the direction of movement X; Y have dimensions that are equal to or less than the aligned dimension of the gap 24, or the distance between the south pole contact section 25 and the north pole contact section 27, respectively, in the direction of movement X; Y.

As further shown in FIGS. 1A and 1C, a primary magnetic flux B1, B2, which defines a first B1 or a second magnetic flux B2 respectively, is generated in the first Y1 and second idle position Y2 by means of the pole shoe surfaces 26, 28 and the pole contact surface 14 contacting the sliding contact element 30, wherein that primary magnetic flux runs annularly over the coil core 11 and the magnetic element 20. The magnetic element 20 and the coil core 11 are held in position by the holding force created by the magnetic pull. An actuation force running transversely to the holding force, acting on the magnetic element 20 or the coil core 11, causes the relative movement between the magnetic element 20 and the coil core 11 in X- or Y-direction of movement, respectively. The coil core 11 is slidably guided along the sliding contact surface 32 in the direction of the intermediate position Y2. The magnetic pull of the magnetic element 20 acting on the coil core 11 is reduced as the distance to the south pole contact section 25 is increased, reaching a lowest value in the intermediate position Y2. Because the sliding contact element 30 is constantly magnetized by the permanent magnet 21, this element exerts a constant magnetic pull on the coil core 11, which ensures a magnetically-induced, continuous attachment of the coil core 11 to the sliding contact element 30 or magnetic contact between these components along the entire movement path between the first Y1 and second idle position Y3. As soon as the coil core 11 leaves the intermediate position Y2 in the direction of the first Y1, or second idle position Y3, respectively, during the relative movement, the magnetic pull of the magnetic element 20 increases, whereby the relative movement between the coil core 11 and the magnetic element 20 experiences acceleration until the coil core 11 has reached the first Y1 or the second idle position Y3. Upon reaching the first Y1 or the second idle position Y3 (FIG. 1A or FIG. 1C respectively), a corresponding magnetic flux B1, B2 is generated, which runs annularly in a direction opposite the direction of the initial magnetic flux. This leads to a reversal in the polarity of the coil that generates an induced voltage, wherein the voltage that is generated preferably can be used for a transmission signal by means of a transmitter assembly that can be connected to the induction generator 1, for example in a wireless switch.

The moving component in the embodiment described in this example can be the coil core 11 or the magnetic element 20. It is also conceivable that the coil core 11 and the magnetic element 20 are movably contained in a housing that receives the induction generator 1, for example the housing of a wireless switch. The magnetic element 20 is preferably provided with the sliding contact element 30 movably disposed thereon. In this way, forces acting in the movable region can be kept low. The first component 10 having the induction coils 16 and the coil core 11 is thereby preferably kept stationary or is fixed in the receiving housing. The individual components 10, 20, 30 of the induction generator 1, as well as the housing that holds or receives the induction generator 1, must be adjusted to one another in the conventional manner, so that the desired functionality, such as fixed attachment and corresponding movable design of the first 10, second 20 or third component 30 between the first Y1 and second idle position Y3, in order to generate an induced voltage, can be achieved.

The above-described switching between the idle positions Y1, Y3 may be done directly, or preferably by one or more spring elements, which, together with the induction generator 1, are held in a housing, for example a wireless switch, wherein the spring elements are disposed and designed in such a way that an actuation force that is exerted on an actuation element of the wireless switch can be transferred to the moving component in a spring-elastic manner, in order to compel an abrupt movement of the component that is to be moved between the idle positions Y1, Y3. To this end, the first 10 and/or second component 20 preferably has points of application for the spring element(s), diagrammatically shown in FIG. 1C, for a spring-elastic transfer of the actuation force needed for switching to the moving component.

Figure 2A:
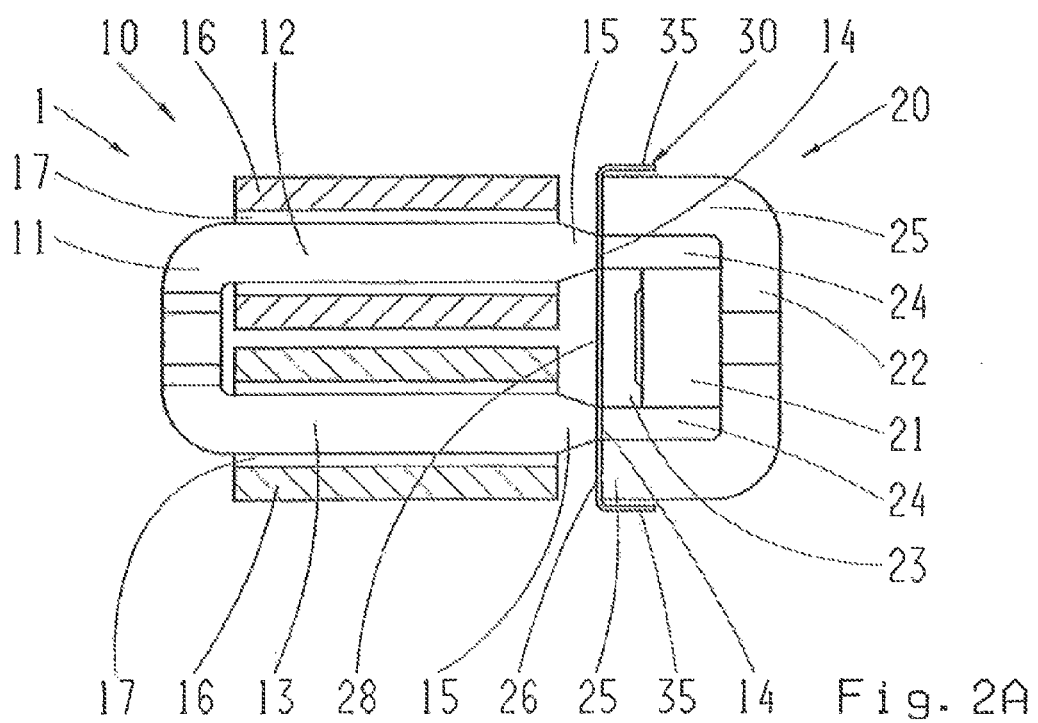
FIG. 2A a schematic side view of an induction generator pursuant to a preferred embodiment in a position that corresponds to an intermediate position.
Figure 2B:
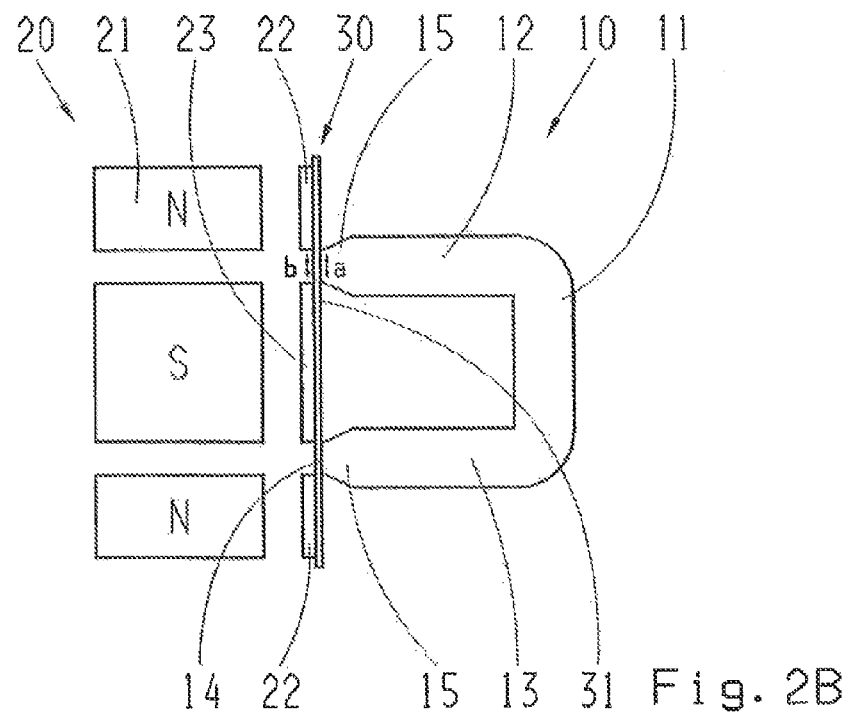
FIG. 2B a schematic representation of the induction generator shown in FIG. 2A.
Figure 3:
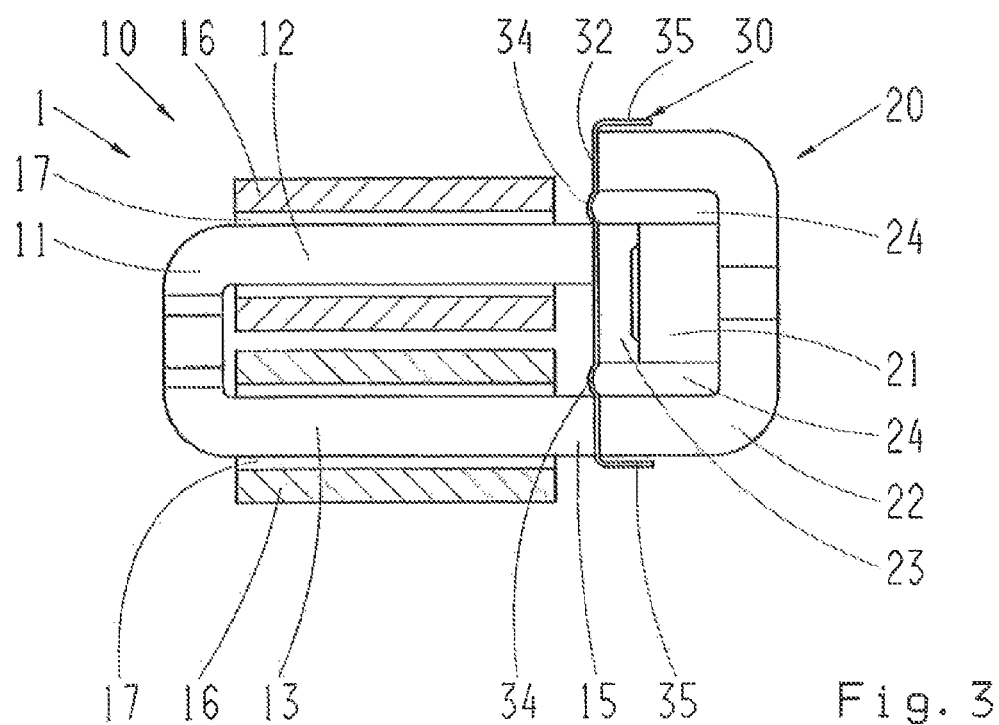
FIG. 3 a schematic representation of an induction generator pursuant to a preferred embodiment in a position that corresponds to a second idle position.

FIGS. 2A to 3 show preferred embodiments of an induction generator 1 according to the present invention, having a different spring device. Specifically, FIGS. 2A and 2B show a schematic side view of an induction generator 1 having a first type of spring device in a position corresponding to the intermediate position Y2, wherein FIG. 2B is a conceptual representation of the induction generator 1 shown in FIG. 2A. FIG. 3 shows a schematic side view of an induction generator 1, having a second type of spring device.

The induction generator 1 shown in FIGS. 2A and 2B differs from the induction generator 1 shown in FIGS. 1A to 1C essentially in the special design of the pole contact sections 15, as well as in the arrangement of the permanent magnet 21, which is rotated by 180°, the U-shaped pole shoe 22 thereof contacting the north pole. The pole contact sections 15 taper in the direction of the pole contact surface 14 to a dimension a, which is equal to or less than a distance b formed between the north pole contact surface 26 and the south pole contact surface 28. When switching between the first Y1 and second idle position Y3, the coil core 11 is attracted to the respective pole shoes 22, 23 in such a way that, after leaving the intermediate position Y2, an abrupt switch is made to the respective first Y1 or second idle position Y3. The tapering pole contact section 15 and the gap 24 thereby form the spring device. In this exemplary embodiment, the induction generator 1 can be actuated at different actuation speeds. The actuation speed that thereby has a direct influence on the energy output of the induction coil 16 that is to be generated, since the switching speed between the idle positions Y1, Y3 is dependent on the actuation speed. In addition, switching from the intermediate position Y2 to the respective idle position Y1, Y3 can be felt, whereby the spring device can also provide a haptic effect. The haptics can be adjusted depending on the selected ratio of distance a to distance b. The smaller the ratio that is selected, the greater the haptic effect that is achieved.

In conjunction with a spring element described above, not shown here, an actuation speed exerted on the spring element has no effective influence on the energy output induced by switching between the idle positions Y1, Y3, since switching, or the switching speed, between the idle positions Y1, Y3 is determined by the abrupt movement generated by the spring element when leaving the intermediate position Y2 during a transition of the spring element from a loaded to an unloaded state. The magnetic pull that arises from the magnetic element 20 favorably supports the abrupt behavior. In this way, a defined energy output can repeatedly be obtained from the induction coil 16, wherein the energy output is independent of the actuation speed exerted on the spring element.

Although a tapered pole contact section 15 is shown and described in this exemplary embodiment, the above-described effect can alternatively be achieved when, instead of tapering the pole contact section 15, the pole shoes 22, 23 are disposed having the same or a greater distance b in reference to distance a.

FIG. 3 essentially shows an induction generator 1 as shown in FIGS. 1A to 1C, with the difference that the sliding contact element 30 comprises a projection 34 that is integrally formed with the sliding contact element 30, that projection being provided in a region that covers the gap 24. The projection 34 forms a ramp for the pole contact section 15 in the direction of the respective idle position Y1; Y3. The projection 34 is formed symmetrically to an apex of the projection 24 that extends perpendicular to a plane and forms a transition at an obtuse angle of 135° on each side of the apex from the ramp to a flat sliding contact section 32, which extends to the projection 34 or to the ramp. The obtuse angle more preferably falls in the range of 135° to 170°. The symmetrical design is not absolutely necessary. In this way, transitions can be formed having different angles, whereby the ramps can be formed having slopes that differ from one another. The apex of the projection 34 is formed such that it is flat. The apex of the projection 34 is formed having an obtuse angle that is preferably equal to or greater than 135° on the side of the sliding contact surface 32. The apex can also have an extension that is parallel to the sliding contact section 32 in the direction of the relative movement.

As in the above-described exemplary embodiment in FIGS. 2A and 2B, the projection 34 allows for an abrupt switch between the idle positions Y1, Y3 and an equal energy output that can be repeatedly generated, independently of the actuation force and actuation speed acting on the spring element, for example in conjunction with a spring element, not shown here. After the spring element has been moved to a loaded state by the actuation force, the first 10 or second component 20 is set in motion by the transition of the spring element from the loaded to the unloaded state, wherein the pole contact section 15 during the relative movement can be freely moved, due to the planar design of the sliding contact section 32, until the projection 34 is reached. At the start of the transition to the projection 34, the relative movement of the pole contact section 15 is first decelerated, so that it can be abruptly accelerated upon reaching the apex of the projection 34. The magnetized sliding contact element 30 thereby guarantees the sliding guidance of the pole contact section 15, which is moved relatively over the projection 34, or the constant magnetic contact of the pole contact section 15 with the sliding contact element 30 during the entire relative movement.

The abrupt switch between the idle positions Y1, Y3 is made perceptible by the projection 34 from the intermediate position Y2, whereby the projection 34 simultaneously forms a haptic element. Depending on the design of the projection 34, the haptics can be adjusted so that they can be perceived differently, or the predetermined definable energy output can be regulated.

The embodiments shown in FIGS. 2A to 3 are advantageously designed for use in applications in which a defined energy output is to be generated repeatedly. These embodiments are also advantageous in applications in which not only the repeatably generated energy output, but also, for example, adjustable haptics, are at issue. This can be realized, for example, in that the actuation force can be exerted directly on the component 10, 20 that is to be moved, without the interposition of a spring element. Thus as described above, the speed at which switching occurs between the idle positions Y1, Y3 depends on the actuation speed. The greater the actuation speed, the faster the relative movement that is carried out, and the greater the energy output that is generated, wherein switching from the intermediate position Y2 to the idle position Y1, Y3 is made perceptible by the respective spring device.

FIG. 4 shows a schematic side view of an induction generator 1 pursuant to an additional preferred embodiment, in which the position corresponds to the intermediate position Y2. The induction generator 1 of this exemplary embodiment differs from the induction generator 1 shown in FIG. 1A to 3 in that the sliding contact element 30 is eliminated. The induction generator 1 comprises a coil core 11 having a pole contact section 15, the pole contact surface 14 thereof having dimensions a greater than the distance b formed between the north pole contact surface 26 and south pole contact surface 28. The pole contact surface 14 hereby forms a sliding contact section having a sliding contact surface for the magnetic element 20. Accordingly, the pole contact section 15 contacts the north pole contact surface 26 and the south pole contact surface 28, at least in the intermediate position Y2, thereby causing a temporary magnetic short circuit. The relative movement between the coil core 11 and the magnetic element 20 may occur without a haptic effect as a result of the ratio between the distance a and b, which is equal to or greater than 1.

The embodiments shown in FIGS. 1 to 5 should not be understood as limiting to the invention. They show preferred embodiments of the present invention. Additional embodiments falling under the subject matter of the claims are conceivable. Thus in an exemplary embodiment, for example, the sliding contact element can be disposed in a gap formed between the south pole contact section and north pole contact section, wherein a sliding contact surface of the sliding contact section is preferably in the same plane as the south pole contact surface and the north pole contact surface. Alternatively, or in addition, a sliding contact element can be disposed in a gap formed between the pole contact sections of the coil core, wherein a sliding contact surface of the sliding contact section preferably lies in the same plane as the pole contact surfaces of the pole contact sections. In addition, the coil core is not limited to a U-shaped design. Thus the coil core can have additional parallel arms or only one arm, wherein the magnetic element must be adapted accordingly. Generally, at least two pole contact surfaces are needed, which can be brought into contact with the south pole contact surface and the north pole contact surface in such a way that an induction voltage can be induced by means of reversal in the polarity of the coil.

In addition, the induction generator 1 can be used in a wireless switch, for example, which has a transmitter assembly and an antenna assembly having an antenna. The induction generator 1 is thereby in electrical contact with this wireless switch by means of a contact element, for example by means of a plug connection, in order to supply energy to the transmitter assembly. The wireless switch can thereby additionally comprise a spring element as described above, in order to compel the relative movement. The spring element can also preferably be designed to be monostable or bistable. In the case of a monostable spring element, the movable component is automatically moved to an initial idle position after a single actuation of the wireless switch. The monostable spring element thereby preferably has a reset function, which is integrally formed with the spring element. In the case of a bistable spring element, the movable component is moved from one idle position to the other idle position after a single actuation of the wireless switch. The bistable spring element is preferably such that the movable component can be moved between repeatedly two idle positions. Both the monostable and the bistable spring element can be a leaf spring or coil spring, for example.

REFERENCE CHARACTERS 1 induction generator
10 first component
11 coil core
12 first arm
13 second arm
14 pole contact surface
15 pole contact section
16 induction coil
17 induction coil channel
18 pole contact surface
20 magnetic element
21 permanent magnet
22 first pole shoe
23 second pole shoe
24 gap
25 south pole contact section
26 south pole contact surface
27 north pole contact section
28 north pole contact surface
30 sliding contact element
31 sliding contact section
32 sliding contact surface
33 cutout
34 projection
35 arm of the sliding contact element
a dimension of the pole contact section
b dimension of the gap
B1 first magnetic flux
B2 second magnetic flux
X; Y direction of movement
Y1 first idle position
Y2 intermediate position
Y3 second idle position

The invention claimed is:

1. An induction generator (1) for a wireless switch, the induction generator (1) comprising:
   a magnetic element (20) having a north pole contact section (27) and a south pole contact section (25),
   a coil core (11) having associated pole contact sections (15) which can contact the north pole contact section (27) and the south pole contact section (25),
   the magnetic element (20) and the coil core (11) being disposed so as to be movable relative to one another so that a reversal of a magnetic flux direction, in the coil core (11), can be generated when switching between first (Y1) and second idle positions (Y3), which define a direction of movement (X; Y) for the relative movement, in which the north pole contact section (27) and the south pole contact section (25) each contact the associated pole contact sections (15), and
   the induction generator (1) having a magnetizable sliding contact section (31) for sliding guidance of the relative movement between the coil core (11) and the magnetic element (20), and the sliding contact section extending parallel to the direction of movement (X; V).

2. The induction generator (1) according to claim 1, wherein the sliding contact section (31) is formed so that the sliding contact section simultaneously contacts the north pole contact section (27) and the south pole contact section (25), at least in the first (Y1) and the second idle positions (Y3) between a defined intermediate position (Y2).

3. The induction generator (1) according to claim 2, wherein the sliding contact section (31) has a magnetic conductivity value that is either equal to or greater than that of a pole contact surface (17) allocated for contact with the north contact section (27) and the south pole contact section (25).

4. The induction generator (1) according to claim 1, wherein the sliding contact section (31) comprises at least one of the associated pole contact sections (15), the sliding contact section (31) extends parallel to the direction of movement (X; Y) so that a gap (24), defined between the north pole contact section (27) and the south pole contact section (25), is covered by the sliding contact section (31), at least in the intermediate position (Y2).

5. The induction generator (1) according to claim 4, wherein the induction generator (1) comprises a sliding contact element, which has a sliding contact element section adjacent to at least one of the associated pole contact sections (15), and a sliding contact element sector forms the sliding contact section (31) with the at least one associated pole contact section (15).

6. The induction generator (1) according to claim 5, wherein the sliding contact element has a cutout for enclosing at least one pole contact section (15).

7. The induction generator (1) according to claim 5, wherein the sliding contact element (30) is either a thin sheet or a foil formed from a magnetizable material.

8. The induction generator (1) according to claim 1, wherein the induction generator (1) has a sliding contact element (30) that forms the sliding contact section (31), the sliding contact section (31) is disposed at least in a region of a gap (24) defined between the north pole contact section (27) and the south pole contact section (25), and connects the north pole contact section (27) with the south pole contact section (25).

9. The induction generator (1) according to claim 8, wherein the sliding contact element (30) has a cutout for enclosing at least one of the north pole contact section (27) and the south pole contact section (25).

10. The induction generator (1) according to claim 1, wherein the induction generator (1) comprises a sliding contact element (30) that forms the sliding contact section (31), which is disposed between the coil core (11) and the magnetic element (20) to attach the sliding contact section (31) to the associated pole contact sections (15), to the north pole contact section (27) and the south pole contact section (25) when the core coil and the magnetic element are in the first idle position (Y1), the second idle position (Y3) and the intermediate position (Y2).

11. The induction generator (1) according to claim 10, wherein the sliding contact section (31) has at least one cutout (33).

12. The induction generator (1) according to claim 1, wherein the induction generator (1) comprises at least one spring device (a, b; 34) by which the relative movement, between the coil core (11) and magnetic element (20), can be accelerated at a constant, pre-definable value, independent of an actuation force that produces the relative movement and of an actuation speed associated therewith.

13. The induction generator (1) according to claim 12, wherein the spring device (a, b; 34) is operative between the first (Y1) and the second idle positions (Y3), and in a region between the north pole (27) and the south pole contact sections (25) that corresponds to an intermediate position (Y2).

14. The induction generator (1) according to claim 13, wherein the spring device (a, b; 34) comprises either a first distance (a) and a second distance (b) or a projection (34), and a ratio of the first distance (a) to the second distance (b) is ≤1, the first distance (a) being an extension of a pole contact surface that runs parallel to the direction of the relative movement (X; Y), this associated pole contact section (15) being formed by the pole contact surface (14), the second distance (b) being an extension of a gap (24) that runs parallel to the direction of the relative movement (X; Y), the gap being formed between the south pole contact section (22) and the north pole contact section (23); and the projection (34) is formed by the sliding contact element (30).

15. A wireless switch in combination with an induction generator (1), the wireless switch having a transmitter assembly and an antenna, and the induction generator (1) for the wireless switch comprising a magnetic element (20) having a north pole contact section (27) and a south pole contact section (25), and a coil core (11) having pole contact sections (15), which can contact the north pole contact section (27) and the south pole contact section (25), the magnetic element (20) and the coil core (11) are disposed so as to be movable relative to one another, such that a reversal of a magnetic flux direction in the coil core (11) can be generated when switching between first (Y1) and second idle positions (Y3), which define a direction of movement (X; Y) for the relative movement, in which the north pole (27) and the south pole contact sections (25) each contact the respective associated pole contact sections (15), the induction generator (1) has a magnetizable sliding contact section (31) for the sliding guidance of the relative movement between the coil core (11) and the magnetic element (20), and the sliding contact section extending parallel to the direction of movement (X; Y).

16. An induction generator for a wireless switch, the induction generator comprising:
 a planar magnetizable sliding contact section having opposing and parallel surfaces,
 a magnetic element having a north pole contact section and a south pole contact section,
 a coil core having first and second pole contact sections,
 the magnetic element and the coil core being slidable relative to one another along the opposing surfaces of the sliding contact section between a first idle position and a second idle position, the north contact section and the south pole contact section of the magnetic element being in with one of the surfaces of the sliding contact section and the first and the second pole contact sections of the coil core being in contact with the other surface of the sliding contact area,
 in the first idle position, the first pole contact section of the coil core is aligned with the south pole contact section of the magnetic element and the second pole contact section of the coil core is aligned with the north pole contact section of the magnetic element such that a magnetic flux is generated in the coil core in one direction, and
 in the second idle position, the first pole contact section of the coil core is aligned with the north pole contact section of the magnetic element and the second pole contact section of the coil core is aligned with the south pole contact section of the magnetic element such that the magnetic flux is generated in the coil core in a reverse direction.

\* \* \* \* \*